United States Patent
Yamamoto et al.

(10) Patent No.: US 8,648,323 B2
(45) Date of Patent: Feb. 11, 2014

(54) NONVOLATILE MEMORY DEVICE AND METHOD OF FABRICATING THE SAME

(75) Inventors: Kazuhiko Yamamoto, Yokohama (JP); Takuya Konno, Palo Alto, CA (US); Takeshi Yamaguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 833 days.

(21) Appl. No.: 12/724,732

(22) Filed: Mar. 16, 2010

(65) Prior Publication Data
US 2011/0049463 A1 Mar. 3, 2011

(30) Foreign Application Priority Data
Aug. 28, 2009 (JP) .................... 2009-198229

(51) Int. Cl.
*H01L 47/00* (2006.01)
(52) U.S. Cl.
USPC ........................ 257/2; 257/3; 257/4
(58) Field of Classification Search
USPC .............................................. 257/2–4
See application file for complete search history.

(56) References Cited

U.S. PATENT DOCUMENTS

| | | | |
|---|---|---|---|
| 8,089,796 B2 | 1/2012 | Tsukamoto et al. | |
| 2008/0170429 A1 | 7/2008 | Bertin et al. | |
| 2010/0245029 A1* | 9/2010 | Schricker et al. | 338/13 |

FOREIGN PATENT DOCUMENTS

| | | |
|---|---|---|
| JP | 2005-524000 | 8/2005 |
| JP | 2006-222428 | 8/2006 |
| JP | 2008-166591 | 7/2008 |
| WO | WO 2009/088890 A2 | 7/2009 |
| WO | WO 2009/088890 A3 | 7/2009 |
| WO | WO 2009/122569 A1 | 10/2009 |

OTHER PUBLICATIONS

Office Action issued Nov. 29, 2011, in Japanese Patent Application No. 2009-198229 with English translation.
Y. Zhang, et al., "Heterostructures of Single-Wailed Carbon Nanotubes and Carbide Nanorods", Science, vol. 285, Sep. 10, 1999, 1 front page, pp. 1719-1722.
Franz Kreupl, et al., "Carbon-Based Resistive Memory", IEDM 2008, Technical Digest, pp. 521-524.
U.S. Appl. No. 13/044,865, filed Mar. 10, 2011, Fukumizu et al.
U.S. Appl. No. 13/044,951, filed Mar. 10, 2011, Konno et al.
U.S. Appl. No. 13/052,354, filed Mar. 21, 2011, Nakao et al.
U.S. Appl. No. 13/404,678, filed Feb. 24, 2012, Kobayashi, et al.
U.S. Appl. No. 13/019,630, filed Feb. 2, 2011, Yamamoto, et al.
U.S. Appl. No. 13/043,923, filed Mar. 9, 2011, Kobayashi, et al.
U.S. Appl. No. 12/956,548, filed Nov. 30, 2010, Yamamoto, et al.

* cited by examiner

Primary Examiner — Samuel Gebremariam
(74) Attorney, Agent, or Firm — Oblon, Spivak, McClelland, Maier & Neustadt, L.L.P.

(57) ABSTRACT

A nonvolatile memory device includes: a substrate; a first electrode formed on the substrate; a resistance change layer formed on the first electrode, the resistance change layer containing conductive nano-material; a second electrode formed on the resistance change layer; and an insulating buffer layer disposed between the first electrode and the resistance change layer, the insulating buffer layer containing conductive material dispersed therein for assuring the electric conductivity between the first electrode and the resistance change layer.

7 Claims, 5 Drawing Sheets

NONVOLATILE MEMORY DEVICE AND METHOD OF FABRICATING THE SAME

CROSS-REFERENCE TO RELATED APPLICATION

This application is based on and claims the benefit of priority from the prior Japanese Patent Application No. 2009-198229, filed on Aug. 28, 2009, the entire contents of which are incorporated herein by reference.

BACKGROUND OF THE INVENTION

1. Field of the Invention

This invention relates to a nonvolatile memory device, in which conductive nano-material is used as a resistance change layer, and a method of fabricating the same.

2. Description of the Related Art

Recently, in accordance with the popularization of potable information terminals and information-digitalization, there is rapidly increased the demand for portable and large capacity of information recoding/reproducing apparatuses, i.e., memory devices. Specifically, a NAND type of flash memory device and a small HDD (Hard Disk Derive) are widely used because of increasing the memory capacity.

Further increase of the recoding density and the memory capacity is strictly required, and further shrinking, high-integration and high-speed, which are difficult to achieve in a conventional device, are desired. Recently, as an improved memory device, there is noticed a resistance change type of nonvolatile memory device, in which different resistance values are stored as data (for example, refer to non-patent documents 1 and 2).

The memory cell in the resistance change type of nonvolatile memory device is formed of a resistance change layer and electrodes sandwiching it. The resistance change layer stores one of two or more resistance states, for example, a high resistance state or a low resistance state, in a nonvolatile manner. Applying voltage higher than a threshold value, or current, charge, heat or the like to the memory cell, the resistance state is changed, and the changed resistance value will be stored as data. This data may be read out without breaking it.

Presently searched or developed as a resistance change memory material are binary metal oxide such as nickel oxide (NiO) and complex metal oxide such as strontium zirconium oxide ($SrZrO_3$). However, with respect to the metal oxide, it is difficult to not only control composition and crystal structure thereof but also obtain desirable electrical properties with good reproducibility because the properties are unstable. Although the memory material suitable for the resistance change layer is presently searched, there is not yet found a suitable material.

Carbon-system material also is a candidate of the resistance change layer, and material search and forming method thereof are examined (for example, refer to non-patent document 3). Since the carbon-system material is formed of only carbon element, it is relatively easy to control the composition, and the process dependency is a little. Therefore, there is such a merit that the composition control is easy.

However, if not formed under a high temperature and a high pressure, the carbon film easily becomes black lead, i.e., graphite, and the electrical resistivity becomes too low. If the electrical resistivity is low, the operation current of the memory cell becomes large, and it results in that the power consumption becomes large. Additionally, it is considered that the resistance state change of the carbon film is due to the difference of the carbon-coupling state (i.e., 3p3 coupling or sp2 coupling). To change the carbon-coupling state, it is in need of carrying a large current. Therefore, there is such a problem that it is difficult to reduce the operation current.

On the other hand, carbon nano-material, which is a kind of carbon-system film, also is a candidate of the resistance change memory material (for example, refer to patent document 1). "Carbon nano-material" is a generic name of carbon material including carbon nano-tube, fullerenes and the like with a three dimensional structure in nano-scale size. This nano-material layer is different from a bulk film formed as a uniformly-dense film, and has a steric structure, i.e., a three dimensional structure, in which nano-size tubes are stacked in a state with many spaces contained, so that the current pass is limited spatially. Therefore, the current is small in spite of the conductive material, and it becomes possible to reduce the operation current of the memory cell.

In addition, although the detailed mechanism has not yet been found, it is considered that there is a resistance change operation based on "contact" and "non-contact" among nano-materials. This designates a possibility of reducing the operation current of the memory cell.

[Patent Document 1]
JPA-P2005-524000A

[Non-Patent Document 1]
P. Vettiger, G. Cross, M. Despont, U. Drechsler, U. Durig, B. Gotsmann, W. Haberle, M. A. Lants, H. E. Rothuizen, R. Stutz and G. K. Binnig, IEEE Trans. Nanotechnology 1, 39 (2002)

[Non-Patent Document 2]
P. Vettiger, T. Albrecht, M. Despont, U. Drechsler, U. Durig, B. Gotsmann, D. Jubin, W. Haberle, M. A. Lants, H. E. Rothuizen, R. Stutz, D. Wiesmann, G. K. Binnig, P. Bachtold, G. Cherubini, C. Hagleitner, T. Loeliger, A. Pantazi, H. Pozidis and E. Eleftheriou, in Technical Digest, IEDM03 pp. 763-766

[Non-Patent Document 3]
F. Kreupl, R. Bruchhaus, P. Majewski, J. B. Philipp, R. Symanczyk, T. Happ, C. Arndt, M. Vogt, R. Zimmermann, A. Buerke, A. P. Graham and M. Kund, in Technical Digest, IEDM08 pp. 521-524

SUMMARY OF THE INVENTION

According to an aspect of the present invention, there is provided a nonvolatile memory device including:
a substrate;
a first electrode formed on the substrate;
a resistance change layer formed on the first electrode, the resistance change layer containing conductive nano-material;
a second electrode formed on the resistance change layer; and
an insulating buffer layer disposed between the first electrode and the resistance change layer, the insulating buffer layer containing conductive material dispersed therein for assuring the electric conductivity between the first electrode and the resistance change layer.

According to another aspect of the present invention, there is provided a nonvolatile memory device including:
a substrate;
a first electrode formed on the substrate;
a resistance change layer formed on the first electrode, the resistance change layer containing carbon nano-material and insulating material filled up the spaces among the conductive nano-material;
a second electrode formed on the resistance change layer; and metal carbide formed between the first and the second electrodes and the resistance change layer as reaction products thereof.

According to still another aspect of the present invention, there is provided a method of fabricating nonvolatile memory device including:

forming a first electrode on a substrate;

oxidizing the surface of the first electrode to form an oxide film;

forming a resistance change layer containing carbon nano-material on the oxide film;

forming a second electrode on the resistance change layer; and annealing the substrate to form metal carbon as reaction products between the resistance change layer and the oxide film, the metal carbon being penetrated through the oxide film to be contacted with the first electrode.

DETAILED DESCRIPTION OF THE EMBODIMENTS

Prior to the explanation of the embodiments, the principle cell structure of the present invention will be explained below. The principle cell structure has a resistance change layer formed of conductive nano-material, which is sandwiched by lower and upper electrodes used for applying electric field to the resistance change layer.

Figure 1:
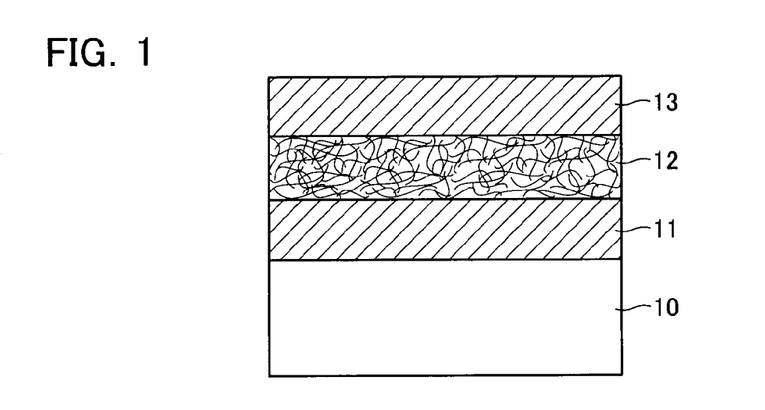
FIG. 1 is a sectional view showing in principle a resistance change device structure in accordance with the present invention.

That is, as shown in FIG. 1, lower electrode 11 is formed on a substrate 10; resistance change layer 12 containing conductive nano-material is formed on the electrode 11; and upper electrode 13 is formed on the resistance change layer 12. Substrate 10 is, for example, a semiconductor substrate such as silicon. Lower and upper electrodes 11 and 13 are, for example, formed of titanium nitride (TiN) films. Resistance change layer 12 is, for example, carbon-system nano-material such as carbon nano-tube (CNT).

In the memory cell structure described above, resistance change layer 12 is a cubic body, in which nano-size tubes are stacked in a state with many spatial gaps contained. Explaining in detail, the atomic occupying rate, i.e., filling-up rate, per a unit volume in the resistance change layer is 25~75%. In other words, the volume ratio of the spaces is 75~25%.

Although CNT is used as the carbon nano-material in the above-description, there may be used single-wall, double-wall or multi-wall carbon nano-tube, fullerenes, graphen, carbon nano-ribbon and the like in place of CNT. The filling-up rate will be changed dependently on the molecular structure and the density of the nano-material.

If the upper electrode 13 is deposited on the resistance change layer 12 with a low filling-up rate, the electrode material will be broken into the spaces in the resistance change layer. Specifically, in case the electrode is deposited by a CVD (Chemical Vapor Deposition) method, in which the film is formed with a chemical reaction in a vapor phase, the electrode material intrusion into the resistance change layer becomes remarkable.

In case the nano-material layer is thin, and the underlying surface is not completely covered, even if electrode is deposited by a directive sputter method, electrode material intrudes into the spaces in the nano-material layer. If the upper electrode material is contacted with the lower electrode through the spaces in the nano-material layer, it becomes in an electrically short-circuited state, resulting in that it becomes impossible to apply voltage to the resistance change layer, and it becomes impossible to do normal memory operation.

To prevent the memory device from being disable, there may be adopted some measures such as: increasing the filling-up rate of nano-material; making the nano-material layer thicker than the upper electrode material intruding depth; making the nano-material covering rate for the lower electrode high; and the like. However, these measures bring various demerits. For example, the increase of the filling-up rate leads to reduction of the electrical resistivity of nano-material. The increase of the layer thickness brings difficulty of the nano-size processing and cost-increase.

In consideration of the above-described situation, to protect the upper and lower electrodes from being short-circuited therebetween, it is desirable to insulate the upper and lower electrodes from each other. On the other hand, the contact resistance between the lower electrode and the resistance change layer, and that between the resistance change layer and the upper electrode need to be sufficiently low for the sake of applying sufficient voltage and sufficient current. In addition, in consideration of the device processing, it matters that the electrodes are mechanically and strongly contacted with the resistance change layer.

In the present invention, taking into consideration the above-described situation, there is prepared an intermediate layer (i.e., insulating buffer layer or other structures serving as the equivalent function) between the nano-material layer and the lower and upper electrodes so as to protect the upper and lower electrodes from being short-circuited and assure the electrical contact between the nano-material and the electrodes.

Some embodiments will be explained below.

First Embodying Mode

Figure 2:
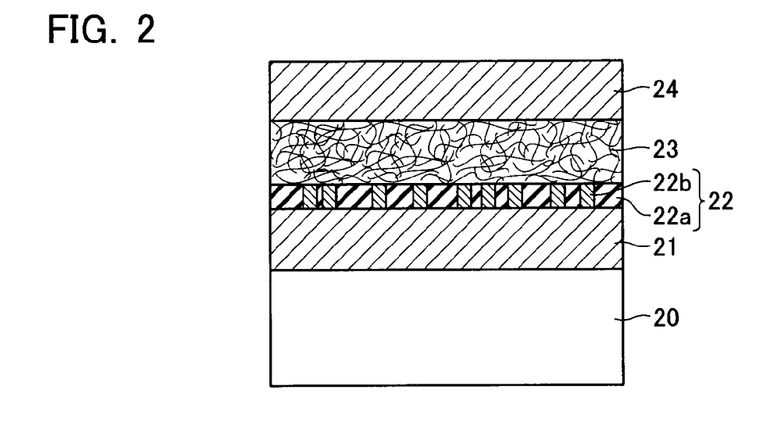
FIG. 2 is a sectional view showing a resistance change device structure in accordance with a first embodiment.

FIG. 2 is a sectional view showing a resistance change device (i.e., nonvolatile memory cell). Substrate 20 is a semiconductor substrate such as silicon. Formed on the substrate 20 is lower electrode 21, on which intermediate layer (insulating buffer layer) 22, resistance change layer 23 formed of conductive nano-material, and upper electrode 24 are formed.

It is different from the basic cell structure shown in FIG. 1 that there is prepared intermediate layer 22 interposed between the lower electrode 21 and resistance change layer 23. The intermediate layer 22 is an insulating buffer layer, which is formed of insulating film 22a containing conductive material 22b, for assuring the electrically conductivity between the resistance change layer 23 and lower electrode 21.

Explaining in detail, the insulating film 22a is, for example, a metal oxide film obtained by oxidizing the lower electrode 21. Alternatively, the insulating film 22a is a metal oxide film deposited on the lower electrode 21. Conductive material 22b is, for example in case resistance change layer 22 is carbon nano-material, metal carbide as reaction products formed at contact portions between the resistance change layer 23 and lower electrode 21. The conductive materials 22b are dispersedly disposed in the insulating film 22a to be penetrated through the insulating film 22a, and contacted with the lower electrode 21.

The above-described intermediate layer 22 serves for preventing the lower and upper electrodes 21 and 24 from being short-circuited, and assuring the electrical contact and chemical coupling between the resistance change layer 23 and the lower electrode 21.

Resistance change layer 23 is a cubic body formed of, for example, nano-size carbon-system nano-material such as single wall, double wall or multi-wall carbon nano-tube (CNT), fullerenes, graphen, carbon nano-ribbon and mixture thereof. Alternatively, it may be adaptable other conductive nano-materials such as silicon-system nano-material in place of or in addition to carbon-system.

Resistance change layer 23 has two or more electrical resistance value states, which are reversibly exchanged. In detail, applying voltage over a threshold voltage, applying current over a threshold current or injecting charge over a threshold charge between the lower and upper electrodes, the electrical resistance value may be exchanged from one state selected in multi-states to another state.

For example, when applied voltage (current or charge) is over the threshold voltage (threshold current or threshold charge), the cell state is changed from a low resistance state to a high resistance state, or from the high resistance state to the low resistance state. The high and low resistance states being assigned to information data, it becomes possible to store data in a nonvolatile manner.

There will be considered some reasons of the resistance change as follows: change of the structure of the nano-material due to applied electric field and the like; defect introduction and correction thereof; coupling change between sp2-coupling and sp3-coupling; and space change among nano-materials. Therefore, it is in need of satisfying the following conditions: nano-material is conductive; and the device has such an electrode structure that a certain electric field is applicable.

Lower electrode 21 and upper electrode 24 are formed of conductive material, for example, one of titanium (Ti), zirconium (Zr), hafnium (Hf), tantalum (Ta), tungsten (W), aluminum (Al) and silicon (Si), or mixture thereof or nitride thereof. Especially, it is useful such a metal that reacts with carbon to form conductive carbide.

Resistance change layer 23 is formed of coarse-grained nano-material and has a little contact portions contacted with others. Therefore, it is only physically struck to the underlying substrate, so that the adhesion is weaker than that of the normal bulk film. In consideration of this situation, in this embodying mode, the resistance change layer 23 is electrically coupled to the lower electrode 21 via intermediate layer 22. That is, conductive materials 22b dispersed in the intermediate layer 22 serve for chemically coupling the resistance change layer 23 to the lower electrode 21. As a result, the adhesion of resistance change layer 23 becomes high, and it will be obtained a high resistance against film-peeling off.

Insulating film 22a is metal oxide, which is formed by oxidizing the lower electrode 21, for example, one selected in titanium oxide, zirconium oxide, tantalum oxide, tungsten oxide, hafnium oxide, aluminum oxide and silicon oxide, or complex oxide thereof or oxinitride thereof. Alternatively, it may be used as the insulating film 22a other insulating films such as an oxide film deposited on the lower electrode 21.

Conductive material 22b is a reaction product, which is produced between the carbon nano-material and the lower electrode, for example, either one of titanium carbide, zirconium carbide, hafnium carbide, tantalum carbide, tungsten carbide, aluminum carbide and silicon carbide, or other metal carbide or complex carbide thereof.

According to this embodying mode, even if electrode material intrudes into the spaces among the nano-material of the resistance change layer 23 when the upper electrode 24 is formed on it, intermediate film 22, the main portion of which is insulating film 22a formed on the lower electrode 21, prevents the lower and upper electrodes from being short-circuited. That is, it matters that conductive materials 22b are buried at contact portions need to be electrically contacted with the lower electrode 21 with a low contact resistance, and the remaining portion is formed of insulating film 22a.

It should be noted that there may be formed other circuit devices under the lower electrode 21. For example, circuit devices such as transistors and diodes may be formed to constitute a peripheral circuit of the cell array on the substrate 20, and the peripheral circuit is covered with an interlayer insulating film, on which the lower electrode 21 is formed.

Second Embodying Mode

Figure 3:
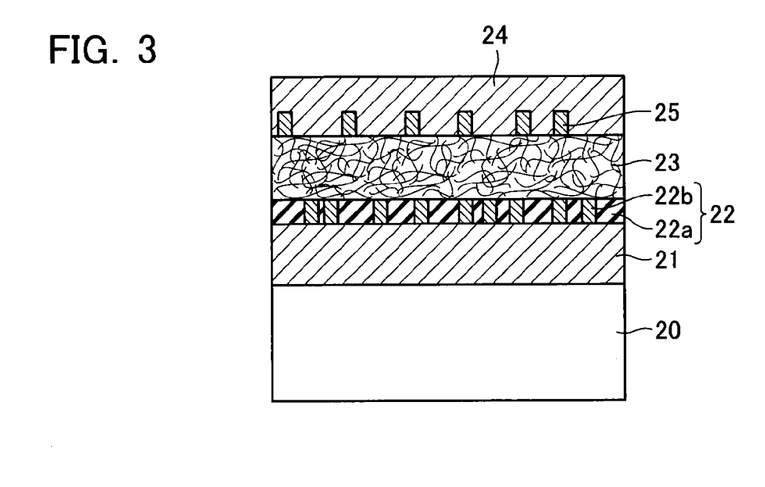
FIG. 3 is a sectional view showing a resistance change device structure in accordance with a second embodiment.

FIG. 3 is a sectional view showing a resistance change device (i.e., nonvolatile memory cell) in accordance with a second embodying mode. The same portions as in FIG. 2 are designated by the same references as in FIG. 2, and the detailed explanation will be omitted.

What is different in this embodying mode from the first embodying mode is that metal carbide 25 is interposed between resistance change layer 23 and upper electrode 24. Explaining in detail, for example, assuming that resistance change layer 23 is carbon nano-material, metal carbide 25 is a reaction product produced between the resistance change layer 23 and the upper electrode 24. With this structure, it will be achieved an electrically and chemically good coupling state between resistance change layer 23 and upper electrode 24.

It should be confirmed that metal carbide 25 is formed at a contact portion between nano-material and upper electrode. In FIG. 3, metal carbide 25 is shown as if intruded into upper electrode 24, but it may be formed in the nano-material layer. In detail, metal carbide 25 is selected correspondingly to the upper electrode material. For example, it is either one of titanium carbide, tantalum carbide, zirconium carbide, hafnium carbide, tungsten carbide, aluminum carbide and silicon carbide, or complex carbide thereof.

According to this embodying mode, not only the same effect as in the first embodying mode may be obtained, but also the contact resistance between the upper electrode 24 and resistance change layer 23 is lowered, and a good conductive state may be obtained. Additionally, the adhesion between upper electrode 24 and resistance change layer 23 may be improved due to the chemically coupled metal carbide 25. Therefore, with respect to the upper electrode 24 or other films stacked thereon, it may be avoided peeling off due to film stresses such as compressing stress and pulling stress. As a result, operation properties and reliability of the device may be improved.

Third Embodying Mode

Figure 4:
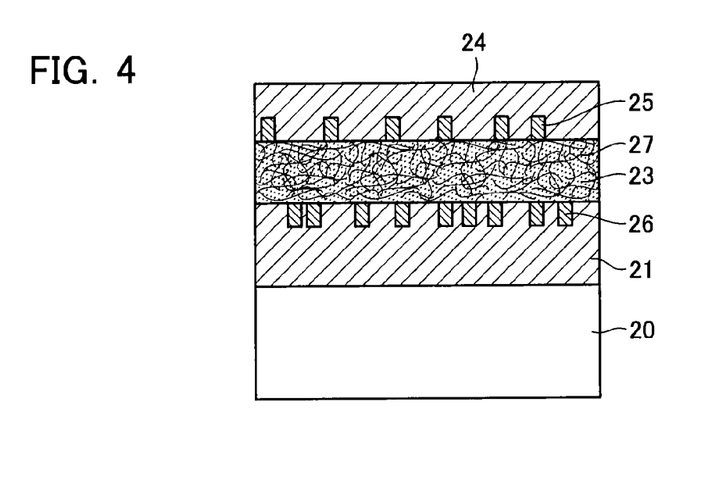
FIG. 4 is a sectional view showing a resistance change device structure in accordance with a third embodiment.

FIG. 4 is a sectional view showing a resistance change device (i.e., nonvolatile memory cell) in accordance with a third embodying mode. The same portions as in FIG. 3 are designated by the same references as in FIG. 3, and the detailed explanation will be omitted.

What is different in this embodying mode from the first and second embodying modes is that insulating materials 27 are filled up the spaces among the nano-materials constituting the resistance change layer 23 between the lower electrode 21 and the upper electrode 14. It should be noted here that it is not required of the insulating materials 27 to completely fill up the spaces in the resistance change layer 23.

With this insulating material filling, it may be avoided such a situation that the electrode material intrudes into the resistance change layer 23 when the upper electrode 24 is formed. Therefore, the electric short-circuit between the upper and lower electrodes 24 and 21 may be avoided.

Insulating material 27 is one selected from titanium oxide, zirconium oxide, tantalum oxide, tungsten oxide, hafnium oxide, aluminum oxide, silicon oxide, complex oxide thereof and oxinitride thereof.

Insulating material 27 does not apply influences to the resistance change layer. Resistance change layer 23 only serves for resistance-changing. In accordance with the insulating material 27, the resistance change operation of the device will become efficient because the current conducting pass is limited in only nano-material in the resistance change layer 23 as a result of filling the insulating material 27. It should be noted that even if there is not insulating material 27, the resistance change is possible. However, the state that there are spaces in the resistance change layer 23 causes an electric short-circuited defect due to conductive impurities mixing. Therefore, insulating material 27 is effective in such a meaning that the cause of the device defects described above is removed.

As similar to the second embodying mode, there are formed metal carbides 25 as reaction products between the upper electrode 24 and the resistance change layer 23. Similarly, there are formed metal carbides 26 as reaction products between the lower electrode 21 and the resistance change layer 23. With these metal carbides 25 and 26, there is achieved good electric contacts between the upper, lower electrode 24, 21 and resistance change layer 23.

There is not used intermediate buffer layer 22 between the lower electrode 21 and resistance change layer 23 in this embodying mode as different from the first and second embodying modes. To achieve the same function as the intermediate buffer layer 22, there are used insulating material 27 filled in the resistance change layer 23 and metal carbides 25 and 26 formed between the lower, upper electrodes 21, 24 and resistance change layer 23.

Alternatively, it is possible to form intermediate buffer layer with metal carbide dispersed therein between the lower electrode 21 and resistance change layer 23 as similar to the first and second embodying modes.

Fourth Embodying Mode

Next, it will be explained below a cross-point type of nonvolatile memory device in accordance with a fourth embodying mode.

Cell Array Construction

Figure 5:
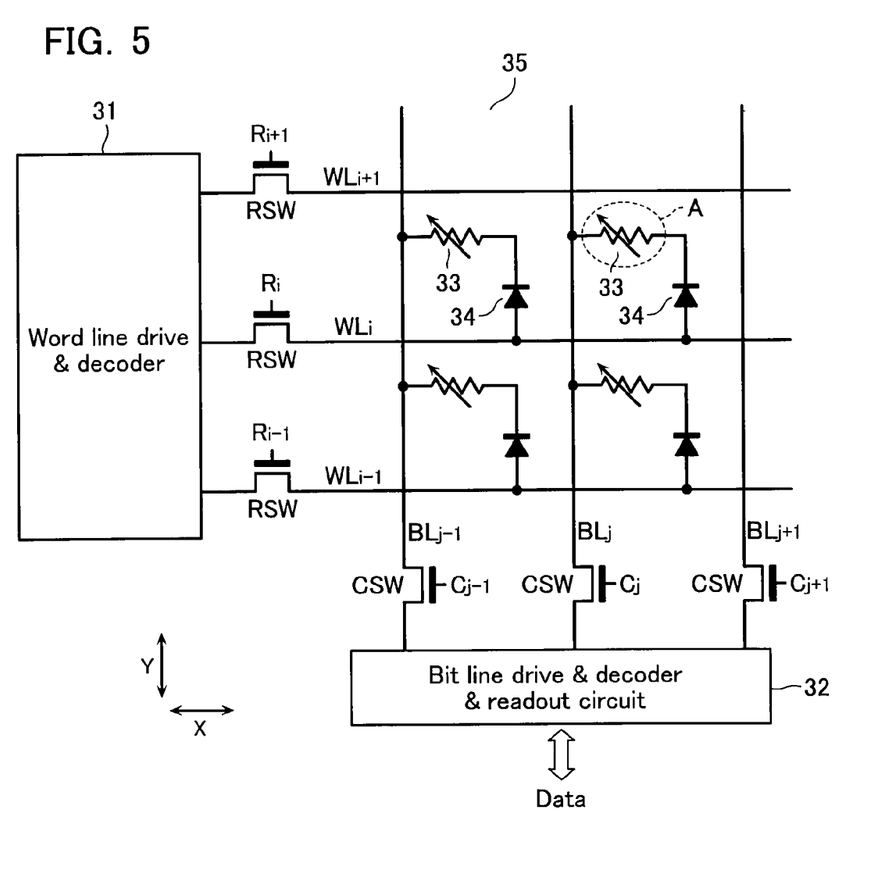
FIG. 5 shows an equivalent circuit of a cross-point type of nonvolatile memory device in accordance with a fourth embodiment.

FIG. 5 shows an equivalent circuit of a cross point type of cell array in accordance with the fourth embodying mode. In the cell array 35, multiple word lines WL (WLi−1, WLi, WLi+1, . . . ) are disposed to be elongated in X direction in parallel with each other; and multiple bit lines BL (BLj−1, BLj, BLj+1, . . . ) are disposed to be elongated in Y direction in parallel with each other. Although FIG. 5 shows only three lines for the word lines and bit lines, there are a lot of word lines and bit lines more than three in a practical cell array.

One ends of word lines WL are coupled to word line driver & decoder 31 via MOS transistors RSW serving as selection switches, respectively; and one ends of bit lines BL are coupled to bit line driver & decoder 32 via MOS transistors CSW serving as selection switches.

Input to gates of MOS transistors RSW are row selection signals R(Ri−1, Ri, Ri+1, . . . ) for selecting one word line (i.e., row); and input to gates of MOS transistors CSW are column selection signals C (Cj−1, Cj, Cj+1, . . . ) for selecting one bit line (i.e., column).

Memory cells 33 are disposed at the respective cross points between word lines WL and bit lines BL, and these memory cells 33 constitute the cross point type of cell array 35 together with word lines WL and bit lines BL. Memory cell 33 is a resistance change device described in the embodying modes. To prevent the memory cell 33 from being generated with sneak current in a recoding/reproducing mode, diode 34 is coupled in series to the cell 33.

Figure 6:
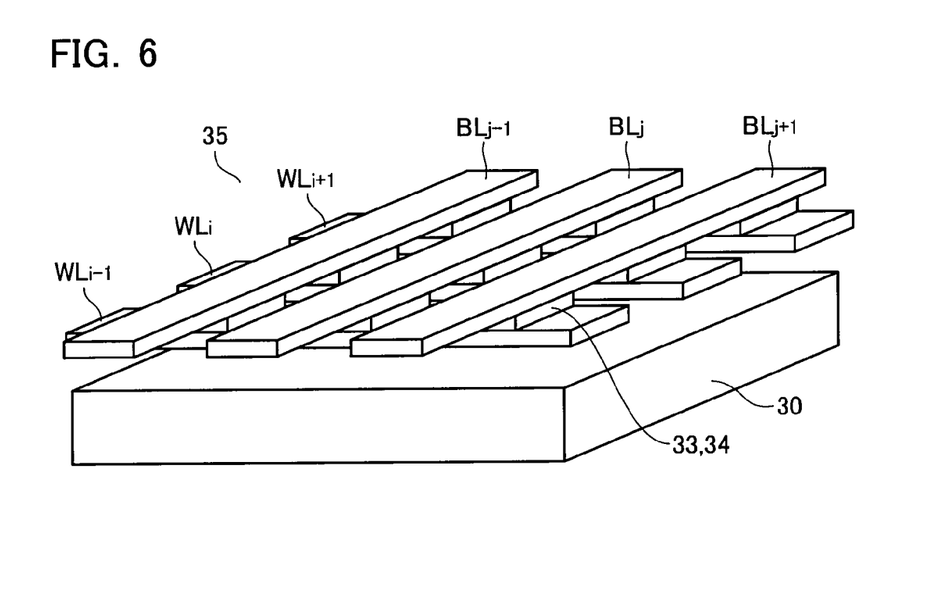
FIG. 6 is a perspective view showing the cell array structure of the nonvolatile memory device.

FIG. 6 is a perspective view showing a stack structure of the cell array 35 shown in FIG. 5. Substrate 30 is a semiconductor substrate covered with an interlayer insulating film, on which word lines WL and bit lines BL are stacked to be arranged to cross each other, and memory cells 33 and diodes 34 are disposed at the respective cross points. This cross-point type of cell array has a feature that a high integration may be achieved because there is no need of disposing MOS transistors at the respective memory cells.

Figure 7:
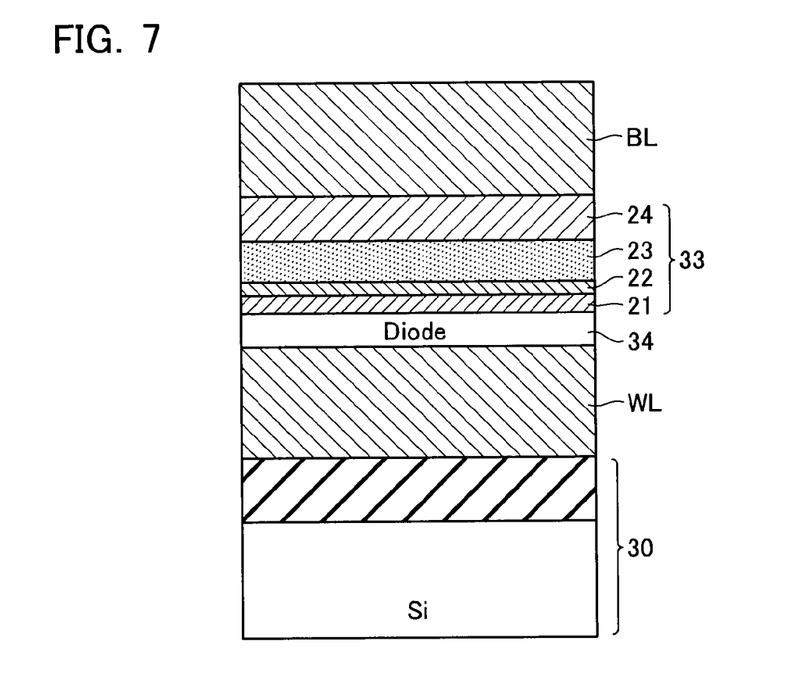
FIG. 7 is a sectional view of the cell array structure.

FIG. 7 is a sectional view showing the detailed cell stack structure. Word line WL is formed on the substrate 30, and diode 34 and memory cell 33 are stacked thereon, further bit line BL is stacked thereon. For example, in case of the first embodying mode, the memory cell 33 is formed of lower electrode 21, intermediate buffer layer 22, resistance change layer 23 and upper electrode 24.

It should be noted that in case the memory cell 33 is set and reset in accordance with the directions of applied voltage, diode 34 may be omitted.

Write (Program)/Erase/Read Operations

Next, it will be explained write (program), erase and read operations of the nonvolatile memory device in accordance with this embodiment. Note here that the memory cell 33 surrounded by a dotted line A in FIG. 5 is a selected cell, which is to be written, erased or read.

Write (or set) of the selected cell is defined as an operation for changing it from a high resistance state to a low resistance state. In detail, apply voltage to the selected cell to generate electric field and carry a current pulse therein. For example, selected word line WLi is set to be higher in potential than selected bit line BLj. Assuming that the selected bit line BLj is fixed in potential (e.g., ground potential), positive voltage is applied to the selected word line WLi.

In this write mode, it is desirable that non-selected word lines WLi−1, WLi+1 and non-selected bit lines BLj−1, BLj+1 all are biased at the same potential. Further, in a standby mode prior to the write mode, it is desirable that all word lines WLi−1, WLi, WLi+1 and all bit lines BLj−1, BLj, BLj+1 are precharged.

Erase (or reset) of the selected cell is defined as an operation for changing it from the low resistance state to the high resistance state. In the erase mode, it is used Joule-heat and the remaining heat generated in the selected cell when a large current pulse is applied to it. Alternatively, it may be used voltage or current energy itself.

For example in the erase mode, selected word line WLi is set to be higher in potential than the selected bit line BLj. Assuming that the selected bit line BLj is fixed at ground potential, positive voltage is applied to the selected word line WLi.

Although in the above-described example, applied voltage in the write mode has the same direction as in the erase mode, the voltage pulse level, current pulse level and pulse width will be selected at suitable values in accordance with operation modes.

In a read mode, a current pulse is applied to the selected cell 33, and the resistance value is detected. The current pulse needs to be set in such a small value that the memory cell's resistance state is not disturbed.

For example, read circuit 32 generates read current (current pulse) to be applied to the selected cell via the selected bit line BLj, and detects the resistance value of the selected cell.

Fabrication Method of Resistance Change Device

Next, it will be explained a fabrication method of the resistance change memory device, noticing the cell array portion.

In the case of the first embodying mode shown in FIG. 2, firstly form lower electrode 21 on the substrate 20, and then oxidize the lower electrode 21 to form intermediate layer 22. In this stage, intermediate layer 22 does not yet include metal carbide 22b, and contains only an oxide film as insulating film 22a. As the method of forming the oxide film, it will be used a wet method for dipping the substrate in oxidizing liquid such as hydroperoxide, or an anneal method for annealing the substrate in oxidizing atmosphere such as oxygen gas, $N_2O$ or NO gas. Alternatively, other anneal methods such as anneal in oxidizing plasma atmosphere may also be used.

In case the intermediate buffer layer 22 is an oxide film, there will be obtained such a merit that the surface of the intermediate layer 22 becomes hydrophile to be easily spread by nano-material dispersed liquid, main component of which is water, when functional liquid including nano-material is spread on the lower electrode to be annealed for forming a resistance change layer. Further, in case of forming nano-material by a CVD method with metal catalyst, the intermediate layer 22 serves for suppressing the reaction between the lower electrode and the metal catalyst. Therefore, it becomes possible to control the nano-material formation by use of controlling the metal catalyst alone.

After forming the intermediate layer 22, form resistance change layer 23 of carbon nano-material. Following it, anneal it in reducing atmosphere to make the resistance change layer 23 and intermediate layer 22 react at the respective contact portions, thereby forming metal carbide 22b. As a result, metal carbides 22b are dispersedly formed in the insulating film 22a to be penetrated through the insulating film 22a. So far, intermediate layer 22 shown in FIG. 2 will be obtained.

The anneal process in reducing atmosphere is specifically material in case the resistance change layer is formed by spreading the functional liquid containing nano-material on the lower electrode and annealing it. Completely evaporating the wasteful water so as to remain only nano-material contained in the functional liquid on the lower electrode, the adhesion of resistance change layer 23 is made to be high. If using not reducing atmosphere but oxidizing atmosphere, carbon nano-material will be oxidized and removed.

In case of the second embodying mode, in addition to the fabrication steps described above, anneal process is performed after forming the upper electrode 24. As a result, as shown in FIG. 3, the contact portions between the resistance change layer 23 and the upper electrode 24 are reacted and metal carbides 25 are formed on the upper electrode 24.

In case of the third embodying mode, the lower electrode 21 is formed on the substrate 20, and then resistance change layer 23 is formed thereon. Note here that the forming step of forming intermediate layer 22 may be adapted prior to the forming step of resistance change layer 23 as similar to the first and second embodying modes.

Performing annealing process after forming the resistance change layer 23, metal carbides 26 are formed as reaction products at the respective contact portions between resistance change layer 23 and the lower electrode 21.

Next, fill-up the spaces in the resistance change layer 23 with insulating materials 27. To form the insulating material 27, it will be used a CVD method for supplying organic metal gas containing one of titanium, zirconium, hafnium, tantalum, tungsten, aluminum and silicon; halogen compound; and oxidizing gas such as oxygen, NO, $N_2O$ and the like. If the organic metal gas contains oxidizing seed, the oxidizing gas such as oxygen, NO, $N_2O$ and the like may be omitted.

Alternatively, it may be adaptable a sputtering method with a metal target formed of titanium, zirconium, hafnium, tantalum, tungsten, aluminum or silicon in argon and oxygen mixed gas atmosphere. If an oxide target is used, oxygen-mixed gas is unnecessary. Further, to prevent the carbon nano-material from being oxidized, it is desirable to lesson the amount of oxidizing gas.

Thereafter, the upper electrode 24 is formed. As the upper electrode forming method, a CVD method, a sputtering method or a vapor deposition method may be used. After forming the upper electrode 24, an additional anneal process is performed. As a result, metal carbides 25 are formed at the respective contact portions between resistance change layer 23 and upper electrode 24.

SUMMARY

By use of these nonvolatile memory cells with nano-material, it is possible to achieve a high-density storable memory device. Further, disposing an insulating intermediate buffer layer between the upper and lower electrodes, or dispersing insulating material in the resistance change layer, it becomes possible to prevent the upper and lower electrodes from being short-circuited. On the other hand, disposing a conductor at the interface between the resistance change layer and the electrode in such a manner that the conductor is chemically coupled to and strictly contacted with the resistance change layer and the electrode, the electrical conductivity between the upper and lower electrodes is assured, and it becomes possible to prevent the device from being defective due to lack of adhesion of the resistance change layer.

Embodiment

It will be explained a detailed embodiment with reference to FIGS. 8 to 12 showing the sectional views of the respective steps.

Figure 8:
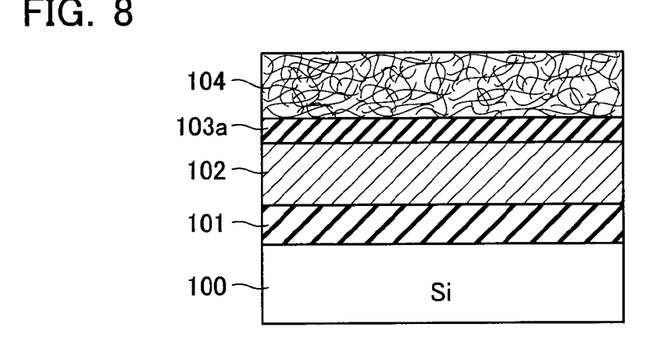
FIG. 8 is a sectional view showing the resistance change layer forming step of the resistance change device in a detailed embodiment.

First, as shown in FIG. 8, silicon oxide film 101 of 200 nm is deposited on a silicon substrate 100, and then lower electrode 102 is formed on the silicon oxide film 101. Explaining in detail, titanium film of 5 nm, titanium nitride film of 10 nm, tungsten film of 50 nm and titanium nitride film of 10 nm are sequentially deposited of the silicon oxide film 102 to constitute the lower electrode 102.

The silicon oxide film 101 is deposited by a low-pressure CVD method with TEOS (tetraethoxysilane:Si(OC$_2$H$_5$)$_4$) used as raw materials. Alternatively, other methods such as an anneal-oxidizing method may be used for forming the oxide film 101. The reason why this silicon oxide film 101 is formed is for protecting the electrode 102 from being reacted with the substrate 100 and abnormally grown to generate defects.

The titanium film serves for increasing the adhesion between the titanium nitride film and silicon oxide film to make the electrode not easily peeled off. The thickness of the titanium nitride film is optional. For example, it is desirable to set the thickness to be 5 nm or more and 50 nm or less. If under 5 nm, the surface is not completely covered with the titanium nitride film, and the flatness will be deteriorated. By contrast, if it is over 50 nm, the adhesion is deteriorated due to the film stress of the titanium nitride film.

The tungsten film is a part of the lower electrode 102 and serves as a stopper when forming a contact hole used for contacting an upper pad with the lower electrode 102. For this purpose, it is desirable to set the thickness of the tungsten film to be 20 nm or more. The lower electrode materials usable in place of tungsten are as follows: titanium, zirconium, hafnium, tantalum, aluminum and silicon, or compound thereof or nitride thereof.

Next, oxidize the surface of the lower electrode 102 to form metal oxide 103*a*. That is, dipping the substrate in an oxidizing liquid such as hydroperoxide or ozonic water, or the mixture thereof, the surface of the tungsten film is oxidized. Alternatively, anneal process in oxidizing gas atmosphere or plasma process may be used.

It is desirable that the thickness of the metal oxide film 103*a* is under 3 nm. If thicker than it, it becomes impossible to form metal carbide as reaction product between the lower electrode and the resistance change layer in the annealing process step performed after forming the resistance change layer, and the lower electrode and the resistance change layer will be completely isolated from each other.

Next, coat carbon nano-tube (CNT) dispersed liquid on the lower electrode, and form resistance change layer 104 with CNT as shown in FIG. 8. In this case, the contact-angle (or wetting angle) of the drop of water is related to the thickness of CNT layer, and it is preferably set to be under 20°. If it becomes 20° or more, the dispersed liquid will be repelled with the lower electrode, so that the CNT film is not formed, or it becomes extremely thin. To make the CNT film thick in this case, it is in need of repeatedly coating the dispersed liquid, and it leads to cost-up.

A CVD method may also be used for forming CNT layer. For example, after forming a cobalt (Co) film as metal catalyst, supply hydrogen-diluted CH$_4$ gas to form CNT.

The thickness of CNT layer is preferably 20 nm or more, and 100 nm or less. If under 20 nm, the resistance value of the resistance change layer 104 becomes too low, and it brings the increase of power consumption. By contrast, if over 100 nm, the film strength lacks, so that the resistance change layer will be easily and physically broken when it is subjected to the memory cell forming process.

Figure 9:
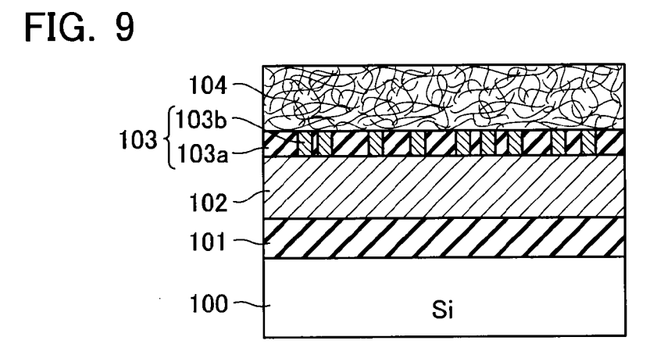
FIG. 9 is a sectional view showing the annealing process step after the resistance change layer forming step.

Following it, anneal the substrate in reducing atmosphere, i.e., hydrogen (H$_2$) atmosphere. As a result, as shown in FIG. 9, tungsten carbides 103*b* are formed as reaction products at the contact portions between CNT in the resistance change layer 104 and the metal oxide film 103*a* of the lower electrode 102 to be penetrated through the oxide film 103*a*.

Note here that the anneal process may be performed in H$_2$ gas atmosphere alone, or H$_2$ gas atmosphere diluted by N$_2$. The annealing temperature is preferably set at 400° C. or higher. It is required of the atmosphere not to contain O$_2$ because if there is remaining O$_2$, CNT reacts with O$_2$ to be volatized.

Excepting the contact portions between CNT and the oxide film of the lower electrode oxide film 103 will be remained as it is. As a result, there is provided an insulating buffer layer (intermediate layer) 103, which has oxide film 103*a* and tungsten carbides 103*b* dispersed therein to be penetrated through the oxide film 103*a*.

Successively, if necessary, fill up insulating material, for example metal oxide, into the resistance change layer 104 formed of CNT. The metal oxide is oxide of metal selected in titanium, zirconium, hafnium, tantalum, aluminum and silicon, or the complex oxide. Deposition method thereof is either one selected in a CVD method, a sputtering method, an evaporating method and the like.

In case of the CVD method, it is desirable to use metal gas containing oxidizing seed. If containing the oxidizing seed in the metal gas, it becomes possible to reduce the supplying amount of oxidizing gas, thereby preventing the carbon nano-material from being oxidized to be volatized. For example, the organic metal gas includes tetraxis (1-methoxy-2-methyl-2-propoxy) group.

In case of the sputter method, it is desirable to use a metal oxide target. If the metal oxide target is used, it becomes unnecessary to use oxygen-mixed plasma gas, and it becomes possible to prevent the carbon nano-material from being oxidized to be volatized.

It should be noted here that the normal CVD method using oxidizing gas and the sputtering method using argon and oxygen mixed gas may be used under the condition that the supplying amount of oxidizing gas is set to be under a certain level, with which the volatizing amount of nano-material is sufficiently suppressed. Forming this insulating layer, the protection for short-circuiting between the upper and lower electrodes may be assured (refer to FIG. 4).

Figure 10:
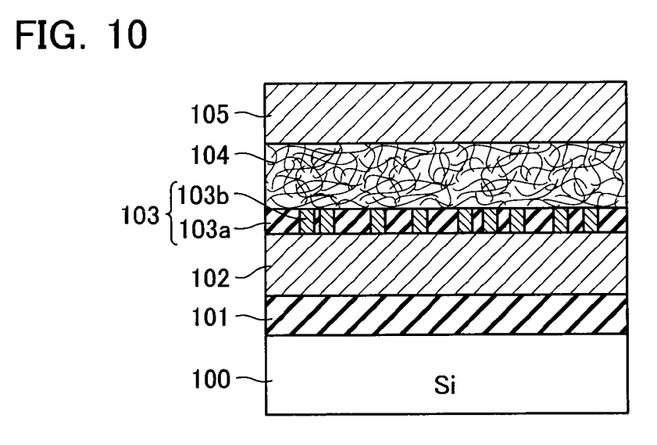
FIG. 10 is a sectional view showing the upper electrode forming step.

Next, deposit a tungsten (W) film of 50 nm as the upper electrode 105 as shown in FIG. 10. Deposition method thereof is either one selected in a CVD method, a sputtering method, an evaporating method and the like.

After depositing the upper electrode 105, perform anneal process preferably at 400° C. or more higher. As a result, tungsten carbides are formed at the contact portions between the upper electrode 105 and CNT, so that the contact resistance between the upper electrode 105 and the resistance change layer 104 will be lowered (refer to FIG. 3).

Figure 11:
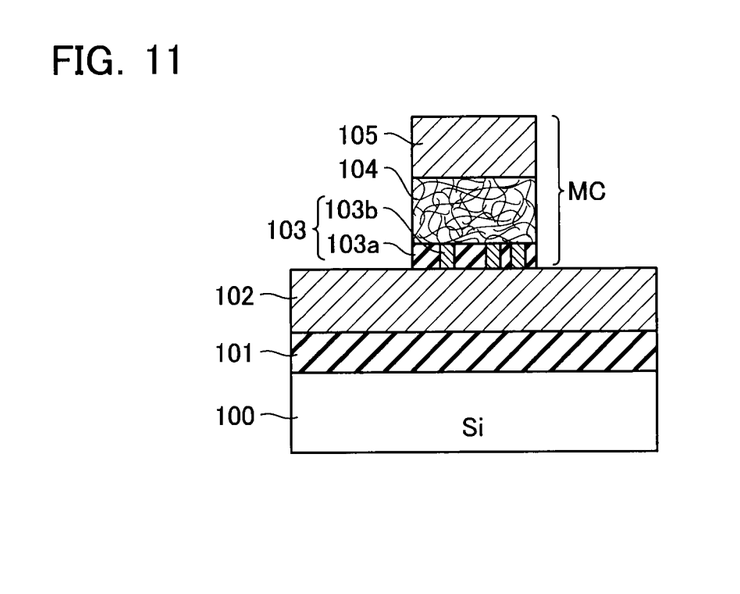
FIG. 11 is a sectional view showing the memory cell patterning step.
Figure 12:
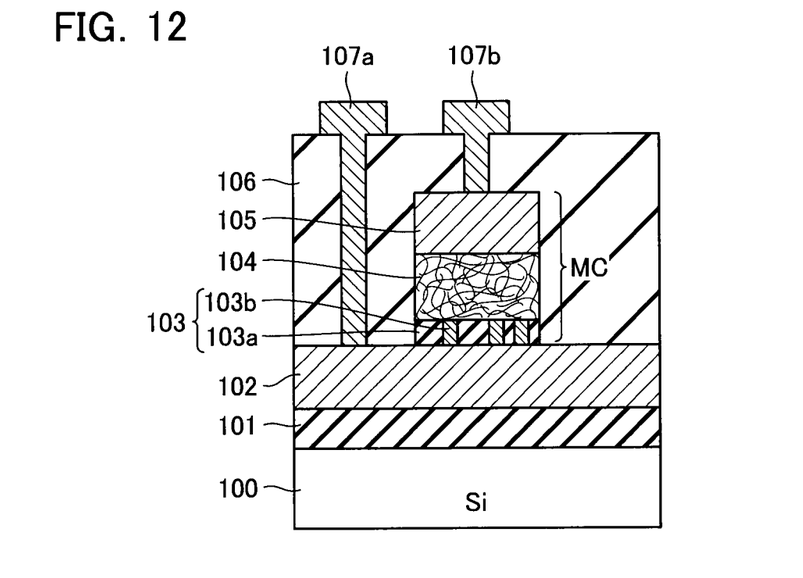
FIG. 12 is a sectional view showing the interlayer insulating film forming step and the electrode pad forming step.

Next, as shown in FIG. 11, process the respective layers 103 to 105 with well-known lithography technology and reactive ion etching (RIE) to form memory cell MC. Further, as shown in FIG. 12, form silicon oxide film as the interlayer insulating film 106, and electrode pads 107*a* and 107*b* on the interlayer insulating film 106 to be contacted with the lower and upper electrodes 102 and 105 via contact holes, respectively.

As explained above, there is provided a resistance change device free from short-circuit between electrodes, in which insulating intermediate layer 103 is sandwiched between resistance change layer 1104 and lower electrode 102. Intermediate layer 103 has insulating film 103*a* and metal carbides 103*b* dispersed therein as reaction products between the lower electrode 102 and resistance change layer 104. Therefore, the electric conductivity of the resistance change devise is assured, and the adhesion of resistance change layer 104 becomes good.

In the embodiment described above, the metal carbide is formed by anneal process halfway in the device fabrication process. By contrast, it may be used another method for forming the metal carbide, in which after forming the upper electrode, apply voltage between the upper and lower electrodes to generate Joule-heat at the contact portion between the electrode metal and resistance change layer, thereby forming metal carbide.

This invention is not limited to the above-described embodiment. For example, plural composition elements disclosed in the embodying modes may be suitably combined. Further, the resistance change layer is not always formed of carbon alone, but other conductive nano-materials may be used as the main component of the resistance change layer.

It will be understood by those skilled in the art that various changes in form and detail may be made without departing from the spirit, scope, and teaching of the invention.

What is claimed is:

1. A nonvolatile memory device comprising:
   a substrate;
   a first electrode formed on the substrate;
   a resistance change layer formed on the first electrode, the resistance change layer containing conductive nano-material;
   a second electrode formed on the resistance change layer; and
   an insulating buffer layer disposed between the first electrode and the resistance change layer, the insulating buffer layer containing conductive material dispersed therein for assuring the electric conductivity between the first electrode and the resistance change layer,
   wherein the insulating buffer layer is a metal oxide film formed by oxidizing the first electrode, the metal oxide film containing metal carbide dispersed therein as the conductive material.

2. The nonvolatile memory device according to claim 1, wherein
   the conductive nano-material contained in the resistance change layer is carbon nano-material.

3. The nonvolatile memory device according to claim 2, wherein
   the metal carbide is generated as reaction products between the metal oxide film and the carbon nano-material contained in the resistance change layer.

4. The nonvolatile memory device according to claim 3, wherein
   the metal carbide is penetrated though the metal oxide film to be contacted with the first electrode.

5. The nonvolatile memory device according to claim 3, further comprising:
   metal carbide formed between the resistance change layer and the second electrode.

6. The nonvolatile memory device according to claim 2, wherein
   the carbon nano-material is one selected from carbon nano-tube, fullerenes, graphen, carbon nano-ribbon and mixture thereof.

7. The nonvolatile memory device according to claim 1, wherein
   the first and the second electrodes are formed of conductive material selected from titanium, zirconium, hafnium, tantalum, tungsten, aluminum, silicon and mixture thereof or nitride thereof.

* * * * *